(12) United States Patent
Shukla et al.

(10) Patent No.: US 10,025,661 B1
(45) Date of Patent: Jul. 17, 2018

(54) ADAPTIVE HARD AND SOFT BIT DECODING

(71) Applicant: SanDisk Technologies LLC, Plano, TX (US)

(72) Inventors: Pitamber Shukla, Milpitas, CA (US); Joanna Lai, San Jose, CA (US); Henry Chin, San Jose, CA (US); Deepak Raghu, San Jose, CA (US); Abhilash Kashyap, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/391,455

(22) Filed: Dec. 27, 2016

(51) Int. Cl.
| G06F 11/00 | (2006.01) |
| G06F 11/10 | (2006.01) |
| G11C 29/52 | (2006.01) |
| G11C 16/34 | (2006.01) |
| G11C 16/28 | (2006.01) |
| G11C 16/10 | (2006.01) |

(52) U.S. Cl.
CPC .......... *G06F 11/1068* (2013.01); *G11C 16/10* (2013.01); *G11C 16/28* (2013.01); *G11C 16/3459* (2013.01); *G11C 29/52* (2013.01)

(58) Field of Classification Search
CPC ..... G06F 11/1068; G11C 16/10; G11C 16/28; G11C 16/3459; G11C 29/52
See application file for complete search history.

(56) References Cited

U.S. PATENT DOCUMENTS

| 6,751,766 | B2 | 6/2004 | Guterman et al. |
| 7,023,735 | B2 | 4/2006 | Ban et al. |
| 7,643,342 | B2 | 1/2010 | Litsyn et al. |
| 7,814,401 | B2 | 10/2010 | Alrod et al. |
| 8,154,921 | B2 | 4/2012 | Mokhlesi et al. |
| 8,499,217 | B2 * | 7/2013 | Song ................... G06F 11/1012 365/185.09 |
| 8,510,636 | B2 * | 8/2013 | Ruby .................. G06F 11/1048 365/185.09 |
| 8,543,891 | B2 * | 9/2013 | Anholt ............... H03M 13/1111 714/699 |
| 8,621,318 | B1 * | 12/2013 | Micheloni ........... G06F 11/1012 714/755 |
| 8,644,067 | B2 | 2/2014 | Jeon |
| 8,687,421 | B2 | 4/2014 | Avila et al. |

(Continued)

*Primary Examiner* — Esaw T Abraham
(74) *Attorney, Agent, or Firm* — Vierra Magen Marcus LLP

(57) ABSTRACT

Technology is described herein for operating non-volatile storage. In one embodiment, the memory system tracks which adjustments to default values for hard bit read reference voltages are most frequently successful to decode data in non-volatile memory cells. In response to a process that uses only hard bits failing to successfully decode data in a group of the non-volatile memory cells, the memory system attempts to decode the data in the group of non-volatile memory cells using dynamic hard bit read reference voltages and dynamic soft bit read reference voltages that correspond to only a subset of the most frequently successful adjustments to the default values for the hard bit read reference voltages. By only using a subset of the most frequently successful adjustments to the default values for the hard bit read reference voltages time and power is saved.

20 Claims, 13 Drawing Sheets

(56) References Cited

U.S. PATENT DOCUMENTS

| | | | |
|---|---|---|---|
| 8,935,595 B2* | 1/2015 | Zhong | G11C 11/5642 |
| | | | 714/773 |
| 8,938,658 B2 | 1/2015 | Tai et al. | |
| 8,943,384 B2 | 1/2015 | Sridhara et al. | |
| 9,135,106 B2 | 9/2015 | Weathers et al. | |
| 9,195,587 B2 | 11/2015 | Kochar et al. | |
| 9,235,467 B2* | 1/2016 | Micheloni | G06F 11/1012 |
| 9,397,701 B1* | 7/2016 | Micheloni | H03M 13/13 |
| 9,450,610 B1* | 9/2016 | Micheloni | H03M 13/1125 |
| 9,454,414 B2* | 9/2016 | Micheloni | G06F 11/00 |
| 9,590,656 B2* | 3/2017 | Micheloni | H03M 13/1111 |
| 2007/0124652 A1 | 5/2007 | Litsyn et al. | |

\* cited by examiner

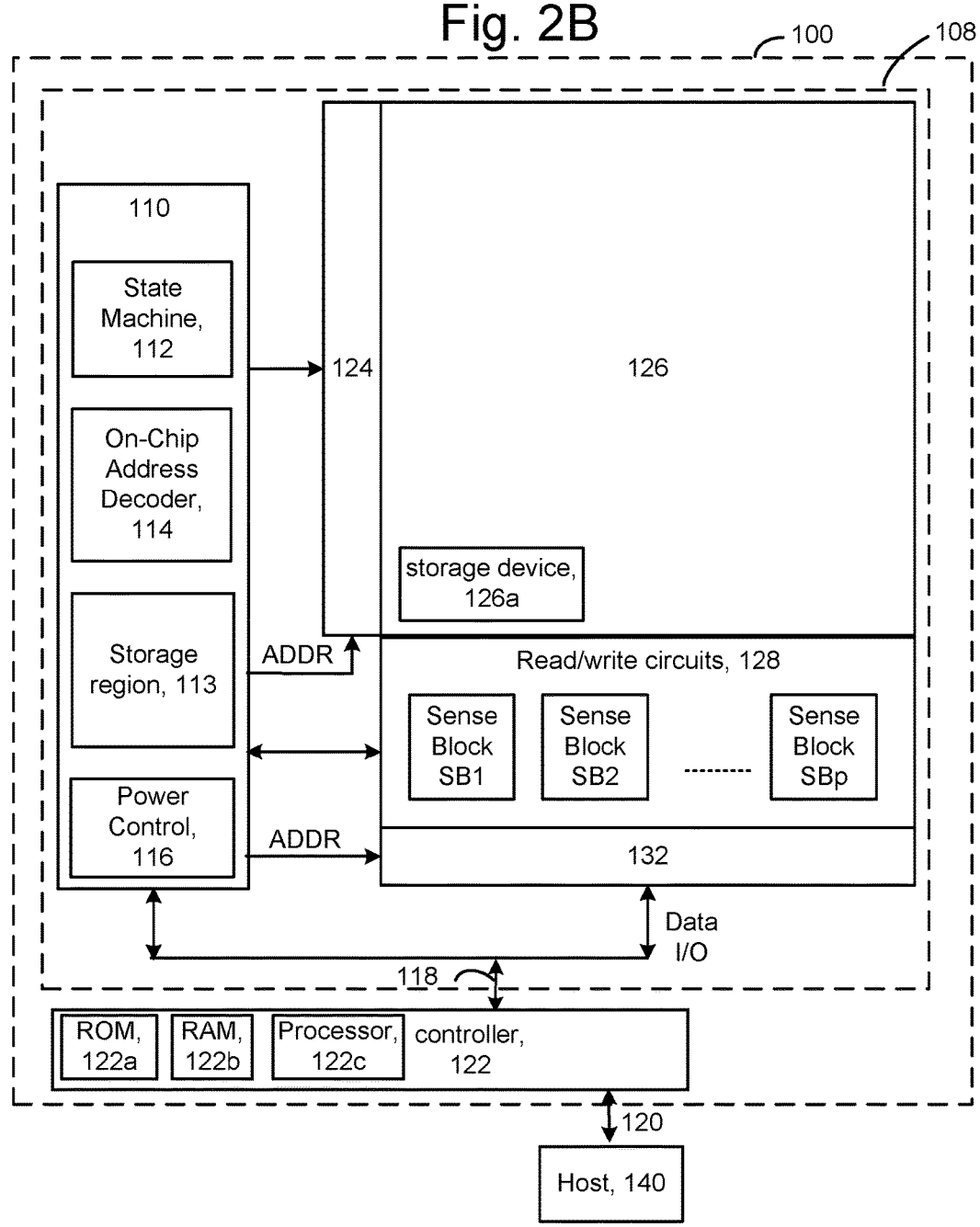

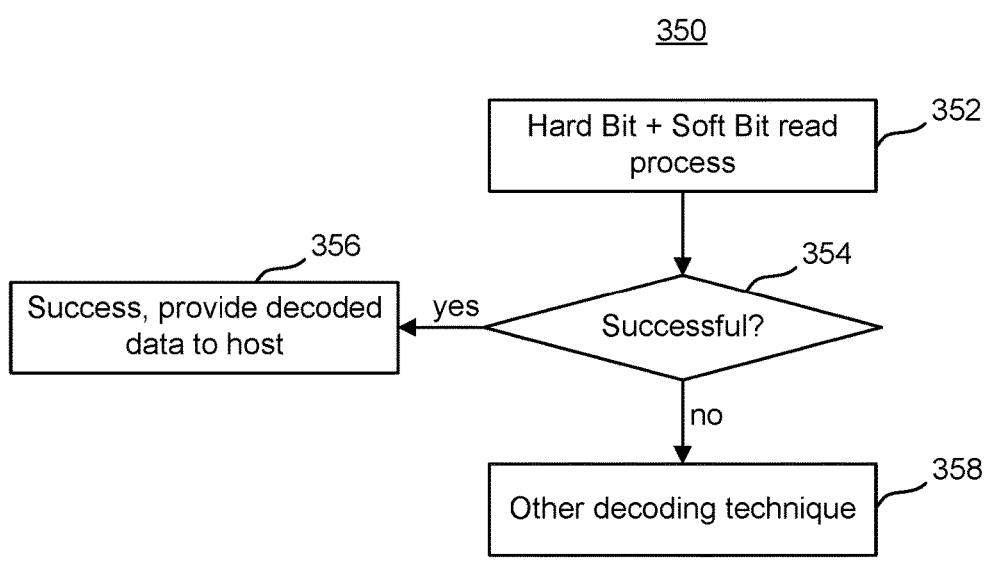

246A    Fig. 4A

| Case | AR | BR | CR | DR | ER | FR | GR |
|---|---|---|---|---|---|---|---|
| 0 | OffA0 | OffB0 | OffC0 | OffD0 | OffE0 | OffF0 | OffG0 |
| 1 | OffA1 | OffB1 | OffC1 | OffD1 | OffE1 | OffF1 | OffG1 |
| 2 | OffA2 | OffB2 | OffC2 | OffD2 | OffE2 | OffF2 | OffG2 |
| 3 | OffA3 | OffB3 | OffC3 | OffD3 | OffE3 | OffF3 | OffG3 |
| 4 | OffA4 | OffB4 | OffC4 | OffD4 | OffE4 | OffF4 | OffG4 |
| 5 | OffA5 | OffB5 | OffC5 | OffD5 | OffE5 | OffF5 | OffG5 |
| 6 | OffA6 | OffB6 | OffC6 | OffD6 | OffE6 | OffF6 | OffG6 |
| 7 | OffA7 | OffB7 | OffC7 | OffD7 | OffE7 | OffF7 | OffG7 |
| 8 | OffA8 | OffB8 | OffC8 | OffD8 | OffE8 | OffF8 | OffG8 |
| 9 | OffA9 | OffB9 | OffC9 | OffD9 | OffE9 | OffF9 | OffG9 |
| 10 | OffA10 | OffB10 | OffC10 | OffD10 | OffE10 | OffF10 | OffG10 |
| 11 | OffA11 | OffB11 | OffC11 | OffD11 | OffE11 | OffF11 | OffG11 |
| 12 | OffA12 | OffB12 | OffC12 | OffD12 | OffE12 | OffF12 | OffG12 |
| 13 | OffA13 | OffB13 | OffC13 | OffD13 | OffE13 | OffF13 | OffG13 |
| ... | ... | ... | ... | ... | ... | ... | ... |
| N-1 | OffAn-1 | OffBn-1 | OffCn-1 | OffDn-1 | OffEn-1 | OffFn-1 | OffGn-1 |

246B

| Case | AR | BR | CR | DR | ER | FR | GR |
|---|---|---|---|---|---|---|---|
| 0 | OffA0 | OffB0 | OffC0 | OffD0 | OffE0 | OffF0 | OffG0 |
| 1 | OffA1 | OffB1 | OffC1 | OffD1 | OffE1 | OffF1 | OffG1 |
| 2 | OffA2 | OffB2 | OffC2 | OffD2 | OffE2 | OffF2 | OffG2 |
| 3 | OffA3 | OffB3 | OffC3 | OffD3 | OffE3 | OffF3 | OffG3 |
| 4 | OffA4 | OffB4 | OffC4 | OffD4 | OffE4 | OffF4 | OffG4 |
| 5 | OffA5 | OffB5 | OffC5 | OffD5 | OffE5 | OffF5 | OffG5 |
| 6 | OffA6 | OffB6 | OffC6 | OffD6 | OffE6 | OffF6 | OffG6 |
| 7 | OffA7 | OffB7 | OffC7 | OffD7 | OffE7 | OffF7 | OffG7 |
| 8 | OffA8 | OffB8 | OffC8 | OffD8 | OffE8 | OffF8 | OffG8 |
| 9 | OffA9 | OffB9 | OffC9 | OffD9 | OffE9 | OffF9 | OffG9 |
| 10 | OffA10 | OffB10 | OffC10 | OffD10 | OffE10 | OffF10 | OffG10 |
| 11 | OffA11 | OffB11 | OffC11 | OffD11 | OffE11 | OffF11 | OffG11 |
| 12 | OffA12 | OffB12 | OffC12 | OffD12 | OffE12 | OffF12 | OffG12 |
| 13 | OffA13 | OffB13 | OffC13 | OffD13 | OffE13 | OffF13 | OffG13 |
| ... | | | | | | | |
| M-1 | OffAm-1 | OffBm-1 | OffCm-1 | OffDm-1 | OffEm-1 | OffFm-1 | OffGm-1 |

Fig. 4B

| Case | Count |
|---|---|
| 0 | 4171 |
| 1 | 521 |
| 2 | 4572 |
| 3 | 243 |
| 4 | 787 |
| 5 | 253 |
| 6 | 467 |
| 7 | 1744 |
| 8 | 8441 |
| 9 | 1920 |
| 10 | 7208 |
| 11 | 129 |
| 12 | 4487 |
| 13 | 747 |
| ... | ... |
| N-1 | 0 |

| Case | AR | BR | CR | DR | ER | FR | GR |
|---|---|---|---|---|---|---|---|
| 8 | OffA8 | OffB8 | OffC8 | OffD8 | OffE8 | OffF8 | OffG8 |
| 10 | OffA10 | OffB10 | OffC10 | OffD10 | OffE10 | OffF10 | OffG10 |
| 2 | OffA2 | OffB2 | OffC2 | OffD2 | OffE2 | OffF2 | OffG2 |
| 12 | OffA12 | OffB12 | OffC12 | OffD12 | OffE12 | OffF12 | OffG12 |
| 17 | OffA17 | OffB17 | OffC17 | OffD17 | OffE17 | OffF17 | OffG17 |
| 0 | OffA0 | OffB0 | OffC0 | OffD0 | OffE0 | OffF0 | OffG0 |

| Case | AR | ER |
|---|---|---|
| 0 | OffA0 | OffE0 |
| 7 | OffA7 | OffE7 |

| Case | BR | DR | FR |
|---|---|---|---|
| 8 | OffB8 | OffD8 | OffF8 |
| 10 | OffB10 | OffD10 | OffF10 |
| 2 | OffB2 | OffD2 | OffF2 |
| 12 | OffB12 | OffD12 | OffF12 |
| 17 | OffB17 | OffD17 | OffF17 |
| 0 | OffB0 | OffD0 | OffF0 |

246B

| Case | CR | GR |
|---|---|---|
| 14 | OffC14 | OffG14 |
| 0 | OffC0 | OffG0 |
| 11 | OffC11 | OffG11 |
| 12 | OffC12 | OffG12 |
| 17 | OffC17 | OffG17 |
| 03 | OffC3 | OffG3 |
| 02 | OffC2 | OffG2 |
| 04 | OffC4 | OffG4 |

Fig. 5E

ADAPTIVE HARD AND SOFT BIT DECODING

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Non-volatile memory cells can be programmed to store one or multiple bits per memory cell. Storing multiple bits of information in a single non-volatile memory cell typically includes mapping bits to states of the non-volatile memory cell. For example, bits "110" may correspond to a first state of a non-volatile memory cell and bits "010" may correspond to a second state of the non-volatile memory. After determining that certain bits are to be stored into a non-volatile memory cell, the non-volatile memory cell may be programmed to a state in order to store the bits. For some memory systems, a group of memory cells are programmed together. For some memory systems, a page is the basic unit of programming user data. Thus, for some memory systems, a page of non-volatile memory cells are programmed together.

Once the memory cells in the memory device have been programmed, data may be read from the memory cells by sensing the programmed states of the memory cells. However, sensed programmed states can sometimes vary from the written programmed states due to one or more factors. Error correction decoding can be used to correct data errors resulting from sensed programmed states that do not match written programmed states.

BRIEF DESCRIPTION OF THE DRAWINGS

FIG. 2B is a functional block diagram of a memory device such as the 3D stacked non-volatile memory device of FIG. 2A.

FIG. 3B is a flowchart of one embodiment of a process of decoding when hard bit only decoding fails.

FIG. 4A is a diagram that illustrates one embodiment of a hard bit dynamic read table.

FIG. 4B is a diagram that illustrates one embodiment of a hard bit plus soft bit dynamic read table.

FIG. 5A is a diagram of an example of a data structure used by the memory system to count the successful hard bit cases.

FIG. 5B is a diagram to illustrate how the hard bit plus soft bit dynamic read table FIG. 4B may be modified based on the most frequently successful hard bit cases.

FIGS. 5C-5E depict examples of hard bit plus soft bit dynamic read tables 246B that are on a page level.

DETAILED DESCRIPTION

Technology is described herein for operating non-volatile storage. In one embodiment, the memory system tracks which adjustments to default values for hard bit read reference voltages are most frequently successful to decode data in non-volatile memory cells. In response to a process that uses only hard bits failing to successfully decode data in a group of the non-volatile memory cells, the memory system attempts to decode the data in the group of non-volatile memory cells using hard bits and soft bits. The process uses dynamic hard bit read reference voltages and dynamic soft bit read reference voltages that correspond to only a subset of the most frequently successful adjustments to the default values for the hard bit read reference voltages. By only using a subset of the most frequently successful adjustments to the default values for the hard bit read reference voltages time and power is saved when reading and decoding using hard bits and soft bits.

In some embodiments, a table of dynamic hard bit plus dynamic soft bit read reference voltages is maintained, based on the most frequently successful hard bit only read/decode. The table may be updated from time to time, based on the most frequently successful adjustments to the default values for the hard bit read reference voltages. This allows the memory system to adapt to changing conditions. For example, as the memory system ages, the optimum read reference voltages can change. In one embodiment, the dynamic hard bit plus soft bit table is maintained for the memory system as a whole. In one embodiment, a separate table is maintained for each memory die. Thus, die to die variations may be accounted for. Dynamic hard bit plus soft bit tables can be maintained for some other level, such as a block level.

Figure 1A:
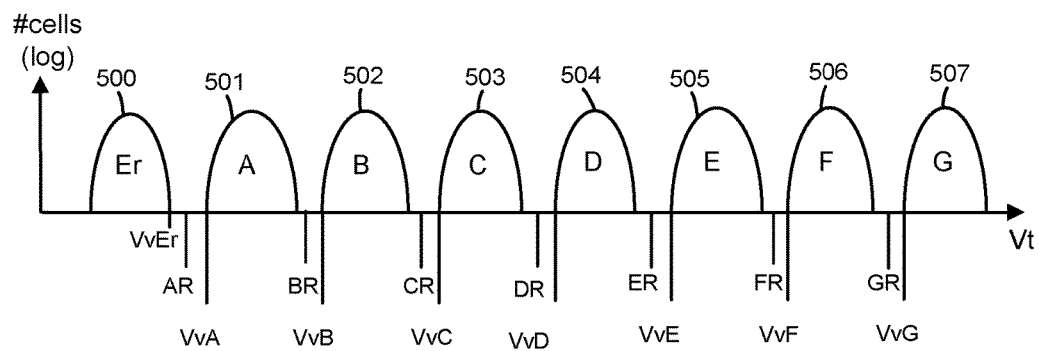
FIG. 1A shows eight $V_T$ distributions corresponding to an Erase state (Er) and programmed states A-G.
Figure 1B:
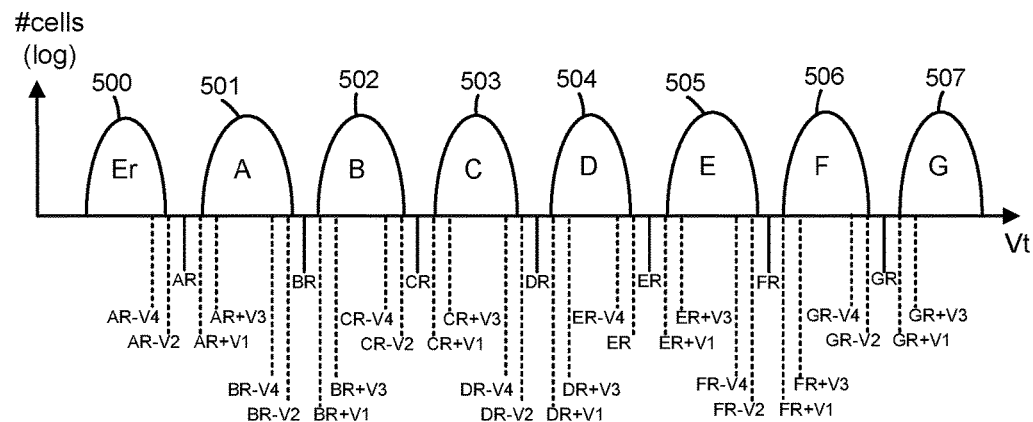
FIG. 1B depicts one example of a set of soft bit read reference voltages.

As noted, the memory system may use both hard bits and soft bits. FIG. 1A will be discussed with respect to hard bit read reference voltages. FIG. 1B will be discussed with respect to hard and soft bit read reference voltages. More than one bit may be stored in a memory cell. For example, when two bits are stored per memory cell there may be four distinct distributions of threshold voltages. When three bits are stored per memory cell there may be eight distinct distributions of threshold voltages. FIG. 1A illustrates example $V_T$ distributions 500-507 corresponding to data states when each non-volatile memory cell stores three bits of data. Other embodiments, however, may use more or fewer than three bits of data per non-volatile memory cell. The y-axis represents the number of non-volatile memory cells. This may be a logarithmic scale. The x-axis represents threshold voltage ($V_T$) of the non-volatile memory cells.

FIG. 1A shows eight $V_T$ distributions 500-507 corresponding to an Erase state (Er) and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

At or near the lower edge of the threshold distribution for each programmed state is a verify reference voltage. For example, FIG. 1A shows VvA for the A-state, VvB for the B-state, VvC for the C-state, VvD for the D-state, VvE for the E-state, VvF for the F-state, and VvG for the G-state. When programming memory cells to a given state, a control circuit in the memory system will test whether those memory cells have a threshold voltage greater than or equal to the verify reference voltage.

Between each adjacent pair of the $V_T$ distributions are read reference voltages used for reading data from memory cells. For example, FIG. 1A shows read reference voltage AR between the erase state and the A-state, BR between the A-state and B-state, CR between the B-state and C-state, DR between the C-state and D-state, ER between the D-state and E-state, FR between the E-state and F-state, and GR between the F-state and G-state. By testing whether the threshold voltage of a given memory cell is above or below the respective read reference voltages, the control circuit can determine what state the memory cell is in. For example, a memory cell whose threshold voltage is greater than DR, but less them ER may be assumed to be in the D-state.

The read reference voltages AR, BR, CR, DR, ER, FR, and GR are referred to herein as "hard bit read reference voltages." Note that when storing more or fewer than three bits per memory cell, there will be different hard bit read reference voltages. Reading the memory cells at these eight hard bit read reference voltages results in a three bit code, in some embodiments. Table I depicts one example coding scheme when storing three bits per memory cell.

TABLE I

| Page | Erase | A | B | C | D | E | F | G | Reads/page |
|---|---|---|---|---|---|---|---|---|---|
| Upper | 1 | 1 | 1 | 0 | 0 | 0 | 0 | 1 | CR, GR |
| Middle | 1 | 1 | 0 | 0 | 1 | 1 | 0 | 0 | BR, DR, FR |
| Lower | 1 | 0 | 0 | 0 | 0 | 1 | 1 | 1 | AR, DR |

In the coding scheme of Table I, the Erase state stores data bits 111, State A stores data bits 110, State B stores data bits 100, etc. The example in Table I is Gray coding because only one bit changes between any two adjacent states. Referring to FIG. 1A, the lower page can be read by reading at AR and ER. The middle page can be read by reading at BR, DR, and FR. The upper page can be read by reading at CR and GR. One aspect to note about the coding scheme of Table I is that the greatest number of reads per page is three. In one embodiment, the sequence of reading the pages is lower, middle, upper. It is not required that the entire sequence is used. For example, reading could stop after reading the lower page, resulting in one bit of information per memory cell. If desired, only the middle page could be read by reading at just BR, DR, and FR. If desired, only the upper page could be read by reading at just CR and GR. Many other possible coding schemes exist. Some coding schemes require more than three reads for a certain page; some coding schemes require only a single read for a certain page.

There is a small, but finite probability that reading a memory cell does not result in the same information that was intended to be programmed therein. For example, over time the amount of charge stored in the memory cell can change, resulting in a change in the threshold voltage of the memory cell. Therefore, a group of memory cells may be programmed with a codeword, which is determined based on an error correcting code (ECC). The codeword may represent the data redundantly. For example, to store a page of 512 bytes of data, some memory cells may be used to store the actual page of data and others may be used to store error correcting codes.

The information from reading the memory cells at the hard bit read reference voltages may be fed into a hard decoder, in one embodiment. In some embodiments, the input to the hard decoder is just the bits of information from the codeword. In other words, when storing three bits per memory cell, the information is just three bits. This information is referred to herein as "hard bits". The hard bit decoder decodes the hard bits to attempt to arrive at the original data. In many cases, this will be successful. However, sometimes the decoding process will be unable to successfully decode the information. One technique for proceeding is to then shift the hard bit read reference levels and again attempt to decode the newly read information. This is referred to herein as "dynamically shifting the hard bit read reference voltages." However, sometimes even with such shifts of the hard bit read reference levels, the hard bit decoder is still unable to successfully decode the information to recover the original data.

One technique for proceeding further is to read the group of memory cells at a set of "soft bit read reference voltages." FIG. 1B depicts one example of a set of soft bit read reference voltages. Near the hard bit read reference voltage "AR" are soft bit read reference voltages AR+V1, AR−V2, AR+V3, and AR−V4. Similar soft bit read reference voltages are near the other hard bit read reference voltages. Each memory cell in a group can be read at the both the hard bit read reference voltages and the soft bit read reference voltages. The information from these reads may be fed into a decoder, which attempts to recover the original information that was programmed into the group. In some embodiments, a soft decoder is used. One embodiment of a soft decoder has as input, for each bit of the codeword, a probability measure that the bit that was read is the bit that was intended to be programmed. This probability is expressed as a log likelihood ratio (LLR), in one embodiment. An LLR is the logarithm of the ratio of the probability that the bit that was written was "0" to the probability that the bit that was written was a "1", given the read threshold voltage.

The additional information learned by reading the soft bits can greatly increase the ability to successfully decode the information. One drawback of using soft bits is that considerably more read reference voltages need to be applied to the memory cell than when just reading hard bits. Also, the decoding algorithm in the soft decoder can take more time to execute than the decoding algorithm in the hard decoder. Thus, the process of reading/decoding with both hard and soft bits can be considerably more time consuming then just reading with hard bits. Moreover, additional power may be consumed.

Techniques are disclosed herein for saving time and/or power when reading and decoding non-volatile memory cells using a combination of hard bits and soft bits. Also, the memory system modifies the hard bit plus soft bit dynamic read table over time. Therefore effects of aging of the memory system may be accounted for. Also, the memory system may maintain separate hard bit plus soft bit dynamic read tables on a memory die basis, memory die basis, system-wide basis, or some other basis. Thus, die-to-die variations, block-to-block variations, and other variations may be accounted for.

Figure 2A:
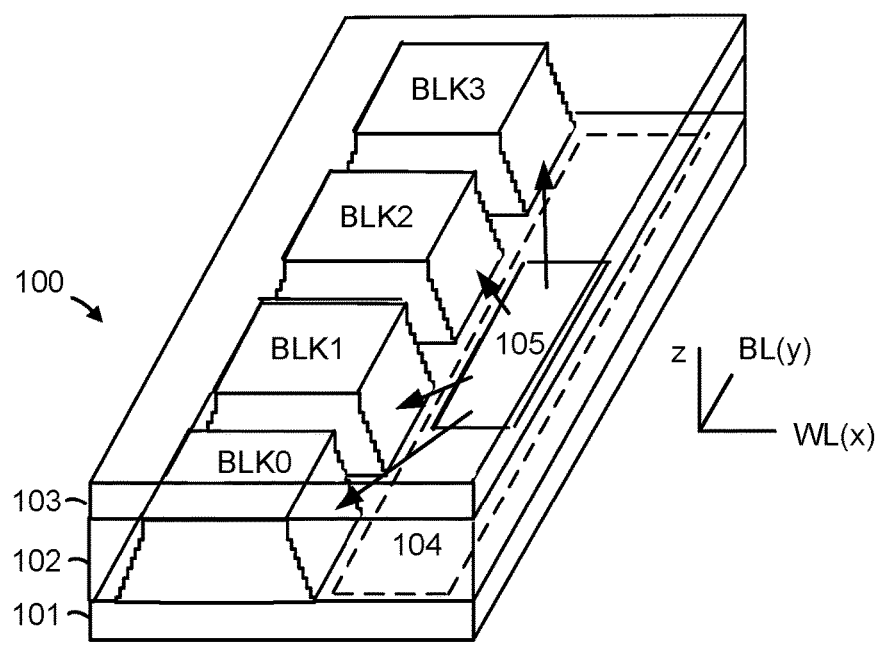
FIG. 2A is a perspective view of a set of blocks in a 3D stacked non-volatile memory device.

Technology described herein may be used with a variety of types of non-volatile memory. One example is a 3D stacked non-volatile memory device. FIG. 2A is a perspective view of a set of blocks in a 3D stacked non-volatile memory device. The memory system 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 2B is a functional block diagram of a memory device such as the 3D stacked non-volatile memory system 100 of FIG. 2A. The memory system 100 may include one or more memory die 108. The set of blocks of FIG. 2A can be on one die. The memory die 108 includes a memory structure 126 of memory cells, such as an array of memory cells, control circuitry 110, and read/write circuits 128. In a 3D configuration, the memory structure can include the blocks of FIG. 2A. The memory structure 126 is addressable by word lines via a row decoder 124 and by bit lines via a column decoder 132. The read/write circuits 128 include multiple sense blocks SB1a, SB2, . . . , SBp (sensing circuitry) and allow a page of memory cells to be read or programmed in parallel. Typically a controller 122 is included in the same memory system 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122*c* and storage devices (memory) such as ROM 122*a* and RAM 122*b*. The storage devices comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

One of skill in the art will recognize that this technology is not limited to the two dimensional and three dimensional exemplary structures described but covers all relevant memory structures within the spirit and scope of the technology as described herein and as understood by one of skill in the art.

Figure 2C:
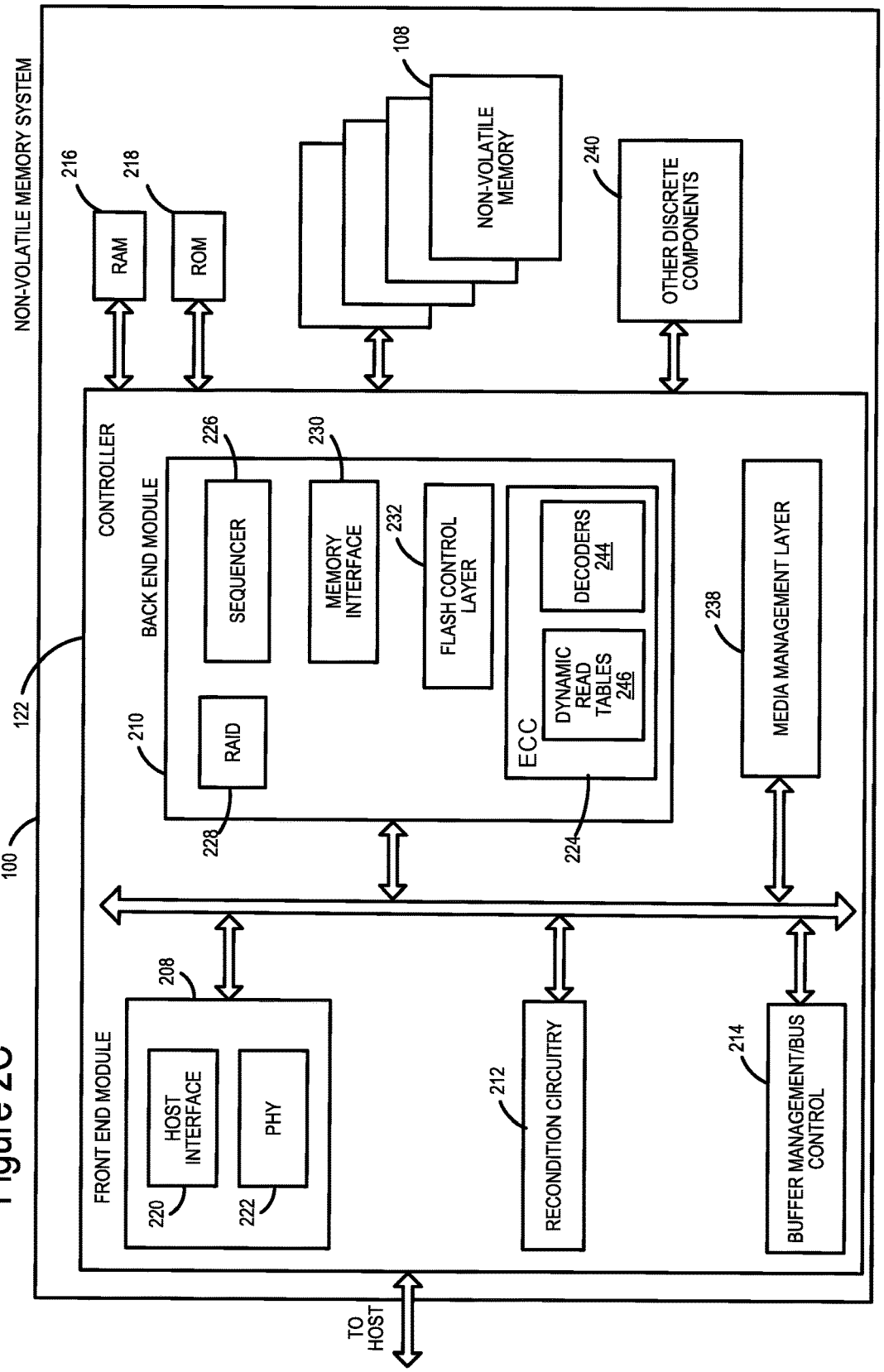
FIG. 2C is a block diagram of example memory system, depicting more details of Controller.

FIG. 2C is a block diagram of example memory system 100, depicting more details of Controller 122. In one embodiment, the system of FIG. 2C is a solid state drive. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address (LA) to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface. In one embodiment, memory system 100 may be a card based system, such as a secure digital (SD) or a micro secure digital (micro-SD) card. In an alternative embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 2C, Controller 122 includes a front end module 208 that interfaces with a host, a back end module 210 that interfaces with the one or more non-volatile memory die 108, and various other modules that perform functions which will now be described in detail.

The components of Controller 122 depicted in FIG. 2C may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 2C is one example implementation that may (or may not) use the components of Controller 122 depicted in FIG. 2B (i.e. RAM, ROM, processor).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 2C as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. The ECC engine 224 has one or more decoders 244 and one or more dynamic read tables 256. In one embodiment, the ECC engine 224 comprises a low-density parity check (LDPC) decoder. In one embodiment, the decoders 244 include a hard decoder and a soft decoder. An output of the one or more decoders 244 may be provided to the host. The controller may be configured to receive hard bit values and soft bit values from the non-volatile memory 108. Hard bit values are derived from reading memory cells at hard bit read reference levels. Soft bit values are derived from reading memory cells at soft bit read reference levels. In one embodiment, hard bit values are input to a hard decoder. In one embodiment, hard bit values and soft bit values are input to a soft decoder.

A dynamic read table 246 (also referred to herein as a read reference voltage table) may have information to adjust a default read reference voltage level. In one embodiment, the dynamic read tables 246 includes a hard bit dynamic read table and a hard bit plus soft bit dynamic read table. A hard bit dynamic read table may contain information for adjusting default hard bit read reference voltage levels. For example, the system 100 may store default a hard bit read reference voltage level for each of AR, BR, CR, DR, ER, FR, and GR, with respect to the example of FIG. 1B. The hard bit dynamic read table may contain offsets to apply to those default levels. Note that for a given case, the offset applied to these various read voltages levels can be the same or different from each other. For example, a +100 mV offset might be applied to the default value of AR, BR, CR, DR, ER, FR, and GR. As another example, the offsets might be: AR+100 mV, BR+75 mV, CR+75 mV, DR+50 mV, ER 0 mV, FR, −50 mV, GR −100 mV. These various sets of dynamic read levels are referred to herein as "cases".

A hard bit plus soft bit dynamic read table may contain information for adjusting both default hard bit read reference voltage levels and default soft bit read reference voltage levels. As noted, the system 100 may store default a hard bit read reference voltage level for each of AR, BR, CR, DR, ER, FR, and GR, with respect to the example of FIG. 1B. Also, the system 100 may store default soft bit read reference voltage level for each of V1, V2, V3, and V4. Thus, from these default values, all of the soft bits in the example of FIG. 1B may be determined. The hard bit plus soft bit dynamic read table may contain offsets to apply to those default levels. In one embodiment, this is achieved by providing an offset to apply to the values for AR, BR, CR, DR, ER, FR, and GR, with respect to the example of FIG. 1B.

In one embodiment, cases in the hard bit plus soft bit dynamic read table correspond to cases in the hard bit dynamic read table. For example, each table may have a case in which +100 mV is applied to the default values for each of AR, BR, CR, DR, ER, FR, and GR; each table may have a case in which +150 mV is applied to the default values for each of AR, BR, CR, DR, ER, FR, and GR, etc. However, note that the hard bit plus soft bit dynamic read table may have considerably fewer cases than the hard bit dynamic read table.

It is possible, though not required, for one embodiment of a hard bit plus soft bit dynamic read table to have offsets for the default values of V1, V2, V3, and/or V4, in the example of FIG. 1B. More generally, the hard bit plus soft bit dynamic read table can provide adjustments to default values for how far the soft bits differ from the hard bits.

The dynamic read tables 246 are stored in ROM 218, in one embodiment. Since the hard bit plus soft bit dynamic read table may be updated, it may be stored in RAM 216 after the update, in one embodiment. In one embodiment, dynamic read tables 246 are stored on a memory die 108. For example, dynamic read tables 246 could be stored in storage device region of array (see 126a, FIG. 2B) or storage region (113, FIG. 2B).

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface. A flash control layer 232 controls the overall operation of back end module 210.

Additional components of system 100 illustrated in FIG. 2C include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory.

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 3A:
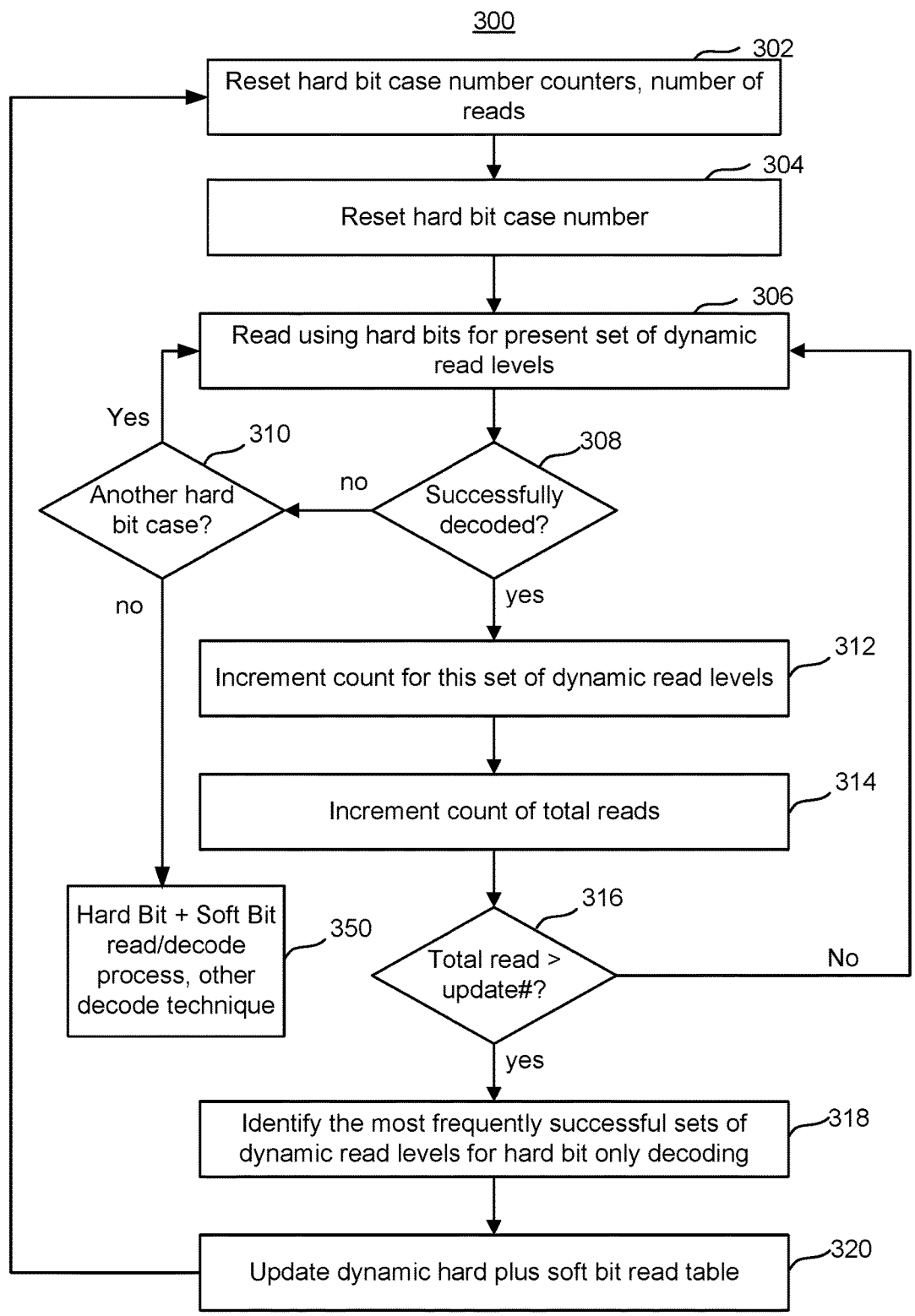
FIG. 3A is a flowchart of one embodiment of a process of reading memory cells in a non-volatile storage system.

FIG. 3A is a flowchart of one embodiment of a process 300 of operating a non-volatile storage system. The process 300 may be performed by a control circuit in the memory system 100. The process 300 may be used to identify which adjustments to default values for hard bit read reference voltages are most frequently successful to decode data non-volatile memory cells using only hard bits. In response to a process that uses only hard bits to fail to successfully decode data in a group of non-volatile memory cells, the memory system may attempt to decode the data in the group of non-volatile memory cells using dynamic hard bit read reference voltages and dynamic soft bit read reference voltages that correspond to only a subset of the most frequently successful adjustments to the default values for the hard bit read reference voltages.

Process 300 involves a hard bit dynamic read table and a hard plus soft bit dynamic read table. The memory system 100 stores an initial table for each, in one embodiment. FIG. 4A is a diagram that illustrates one embodiment of a hard bit dynamic read table 246A. The table 246A has "n" cases, labeled 0 through n−1. Each case is represented by one row. In this embodiment, each case has an offset voltage value for each default hard bit read reference voltage AR, BR, CR, DR, ER, FR, and GR. For example, for case 0, the offsets are OffA0, OffB0, OffC0, OffD0, OffE0, OffF0, and OffG0. Two or more of the offsets in a given row can be equal to each other. On the other hand, all of the offsets in a row can be different from each other. Also, rather than the case containing offsets relative to the default value, the table could contain a voltage value itself for the hard bit read reference voltage.

In one embodiment, the table 246A can be broken into three separate tables—one for each page. For example, the columns for AR and ER can be for a lower page dynamic read table, the columns for BR, DR, FR can be for a middle page dynamic read table, and the columns for CR and GR can be for an upper page dynamic read table. This breakdown is with respect to the example coding of Table I, but there are many other ways to assign hard bit read reference levels to pages. Also, more or fewer than seven read reference voltages can be used. In other words, the memory cells could store more or fewer than three bits each.

FIG. 4B is a diagram that illustrates one embodiment of a hard bit plus soft bit dynamic read table 246B. The table 246B has "m" cases, labeled 0 through m−1. Initially, m could be equal to n, but that is not required. In this embodiment, each case has an offset voltage value for each default hard bit read reference voltage AR, BR, CR, DR, ER, FR, and GR. In one embodiment, the offsets OffA0, OffD0, OffC0, OffD0, OffE0, OffF0, and OffG0 for case 0 in table 246B are equal to the corresponding offsets for case 0 in table 246A. This may also apply for other corresponding cases in the two tables 246A, 246B. It is possible, though not required, for table 246B to have offsets for V1, V2, V3, and/or V4, with reference to FIG. 1A. More generally, the table 246B may include offsets that adjust the gaps between the soft bits and the hard bits.

Process 300 can be performed on a variety of levels. For example, process 300 can be performed on a system wide level, a memory die level, a block level, or some other level. Thus, there could be a separate hard bit plus soft bit dynamic read table 246B for each memory die 108, a separate table 246B for each block, one table 246B for the entire memory system 100, etc. Also, process 300 can be performed on a page level or multi-page level. For example, process 300 can separately track data for each of a lower page, middle page, and upper page, in a three bit per memory cell example.

The memory system 100 has counters for tracking the frequency with which each of the cases in the hard bit dynamic read table 246A results in successfully decoding data in a group (e.g., page) of memory cells, in one embodiment. Step 302 includes setting these counters to zero. The memory system 100 also tracks the number of successful read operations, in one embodiment. Step 302 includes setting a counter of successful read operations to zero.

Step 304 includes resetting a hard bit case number. This refers to the case number from the hard bit dynamic read table 246A. Referring to FIG. 4A, the case number may be reset to 0. Note that the memory system 100 may attempt to decode by trying case 0, then case 1, etc. The case number for the hard bit plus soft bit dynamic read table 246B may also be reset to 0.

Step 306 includes reading a group of non-volatile memory cells using a case of the hard bit read reference levels from the hard bit dynamic read table 246A. For example, the offsets from case 0 may be applied to the default hard bit read reference voltages. In one embodiment, this first read uses the default hard bit read reference voltages, without any voltage offset. Further details of one embodiment of step 306 are discussed with respect to FIG. 6A.

Step 308 is a determination of whether the data in the group of memory cells was successfully decoded. If the data was not successfully decoded, then the group is read using the next case in the hard bit dynamic read table 246A. Thus, step 310 includes a test to determine whether there is another hard bit case that has not yet been attempted. Step 310 may include incrementing the hard bit case number, and determining whether the number is less than "n", with reference to FIG. 4A. If there is another hard bit case to attempt, then the group is read using the next hard bit case, in step 306. Thus, for example, the group may be read using the offsets from Table 246A for case 1.

Step 308 is a determination of whether the data in the group of memory cells was successfully decoded using only hard bits. In the event that the data in the group is successfully decoded using hard bits only, then step 312 is performed. However, if the memory system 100 iterates through all of the cases in the hard bit dynamic read table 246A without any cases successfully decoding the data in the group, then the process moves to block 350. Block 350 represents moving to other decoding techniques. Briefly, block 350 represents first using a hard bit plus soft bit read and decode technique, followed by still another decoding technique if the hard bit plus soft bit read and decode technique is not successful. FIG. 3B shows further details of one embodiment of block 350.

Returning now to discussion of step 312, the count of successful decodes for the present hard bit case is incremented. Thus, the system 100 keeps a running total of the successful decodes of each of the hard bit cases. Note that these counts for each hard bit case may be kept on a system-wide basis, a memory die basis, block level basis, or some other basis.

Step 314 includes incrementing the count of successful reads. Step 316 is a test to determine whether the count of successful reads has reached a threshold (e.g., update#). The threshold is not required to be static throughout the life of the memory system 100. If the total number of successful reads is greater than the threshold, then this indicates that it is time to update the hard bit plus soft bit dynamic read table 246B, based on the successful hard bit case counts. If not, then the process 300 returns to step 306, in which a read of another group of memory cells is performed.

Step 318 includes identifying the most frequently successful hard bit cases that were used during the hard bit only reading/decoding. FIG. 5A shows an example of a data structure 546 used by the memory system 100 to count the successful hard bit cases. The data structure has a column for the case number, which corresponds to the case numbers in the table 246A of FIG. 4A. The data structure has a column labeled "count," which is the number of times each case resulted in successfully decoded data in a group of memory cells. The data structure shows that the most frequently successful cases are cases: 8, 10, 2, 12, 17, and 0, in descending order.

As noted above, process 300 can be performed on a page level, or multi-page level. When performed on a page level, the memory system 100 can track counts for each page. Thus, there could be a separate data structure 546 for each of a lower page, middle page, and upper page.

The table 546 may be stored in RAM 122b, storage device area 126a, or some other location. There may be one such data structure 546 for the entire memory system 100, one table for each memory die 108, one table for each block, etc. A data structure 546 may be maintained for some other unit of memory cells.

Step 320 includes updating the hard bit plus soft bit dynamic read table 246B based on the successful hard bit case counts. In one embodiment, the hard bit plus soft bit dynamic read table 246B is pruned to eliminate all but the most frequently successfully hard bit cases. FIG. 5B shows how the hard bit plus soft bit dynamic read table 246B of FIG. 4B may be modified based on the most frequently successful hard bit cases. In this example, the table 246B of FIG. 4B has been trimmed to only include six cases, as depicted in FIG. 5B. These are the six most frequent cases from the data structure 546. However, a different number of cases could be used.

Also, when performed on a page level, a different number of cases could be used for different pages. FIGS. 5C-5E depict examples of hard bit plus soft bit dynamic read tables 246B that are on a page level. The cases in tables 246B in FIGS. 5C-5E are for purposes of discussion. FIG. 5C depicts a table 246B for a lower page, using the coding scheme from Table I (a different coding scheme may be used). In this example, the most frequently successful hard bit only decodes for the lower page are cases 0 and 7. Only these two most frequently successfully cases are included in the lower page dynamic read table 246B. This is because for this example, using just cases 0 and 7 can successfully decode the lower page using the hard plus soft bit decode with a desired success rate.

FIG. 5D depicts a table 246B for a middle page, using the coding scheme from Table I (a different coding scheme may be used). In this example, the most frequently successfully hard bit only decodes for the middle page are cases 8, 10, 2, 12, 17 and 0. Use of these cases is able to successfully decode the middle page using the hard plus soft bit decode with a desired success rate. In other words, using more cases would be unlikely to result in a successful decode of the middle page.

FIG. 5E depicts a table 246B for an upper page, using the coding scheme from Table I (a different coding scheme may be used). In this example, the most frequently successfully hard bit only decodes for the upper page are cases 14, 0, 11, 12, 17, 3, 2, and 4. Use of these cases is able to successfully decode the upper page using the hard plus soft bit decode with a desired success rate. In other words, using more cases would be unlikely to result in a successful decode of the upper page.

The number of cases to include in each of the tables 246B may be selected to achieve a desired success rate at decoding using the hard plus soft bit process. It is possible to collect empirical data to determine a suitable size for each of the tables 246B. For example, empirical data may be collected to determine a suitable number of cases to include in the tables of FIG. 5B-5E. This is further discussed with respect to FIG. 7.

After step 320, the process 300 returns to step 302. In step 302, the hard bit case number counters are reset. Also, the number of successful reads are reset. Process 300 may then be used again to update the hard bit plus soft bit table 246B. Herein, this is referred to as updating the table 246B for another interval. In this example, the interval is defined based on a number of successful reads. An interval that is based on the number of successful reads is referred to herein as a "read interval." However, alternatively, the interval could be defined using some other metric.

As noted, in the event that none of the hard bit cases in the hard bit dynamic read table 246A are able to decode the data in the group of memory cells, then the process 300 attempts a hard bit plus soft bit read and decode process (block 350). FIG. 3B is a flowchart of one embodiment of block 350. In step 352, a hard bit plus soft bit read and decode process is performed. Step 352 includes using the hard bit plus soft bit dynamic read table 246B. The hard bit plus soft bit read and decode of step 352 goes through all of the cases in table 246B, if needed to decode the data. Step 354 is a determination of whether one of the hard bit plus soft bit cases was successful at decoding the data in the group of memory cells. If so, then the status is set to "success" and the decoded data is provided to the host.

If none of the hard bit plus soft bit cases was successful, then another decoding technique is attempted in step 358. A wide variety of other decoding techniques may be used in step 358. Also more than one other decoding technique may be used in step 358. In one embodiment, step 358 attempts to identify optimal read reference voltages. This may include performing a scan of the memory cells to determine a shape of the memory cell threshold voltage distributions. Step 358 may also include using a stronger, but slower, decoding algorithm. This stronger algorithm uses both hard and soft bits, in one embodiment. Step 358 is not limited to any particular decoding technique.

Figure 6A:
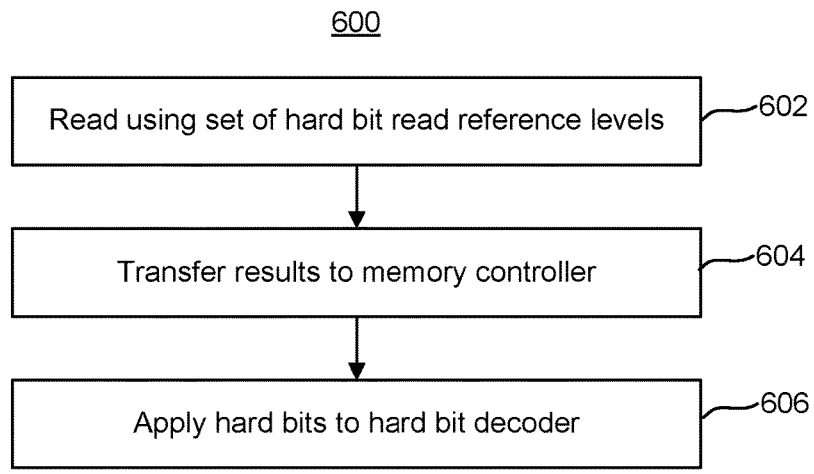
FIG. 6A is a flowchart of one embodiment of a process of hard bit only reading/decoding.
Figure 6B:
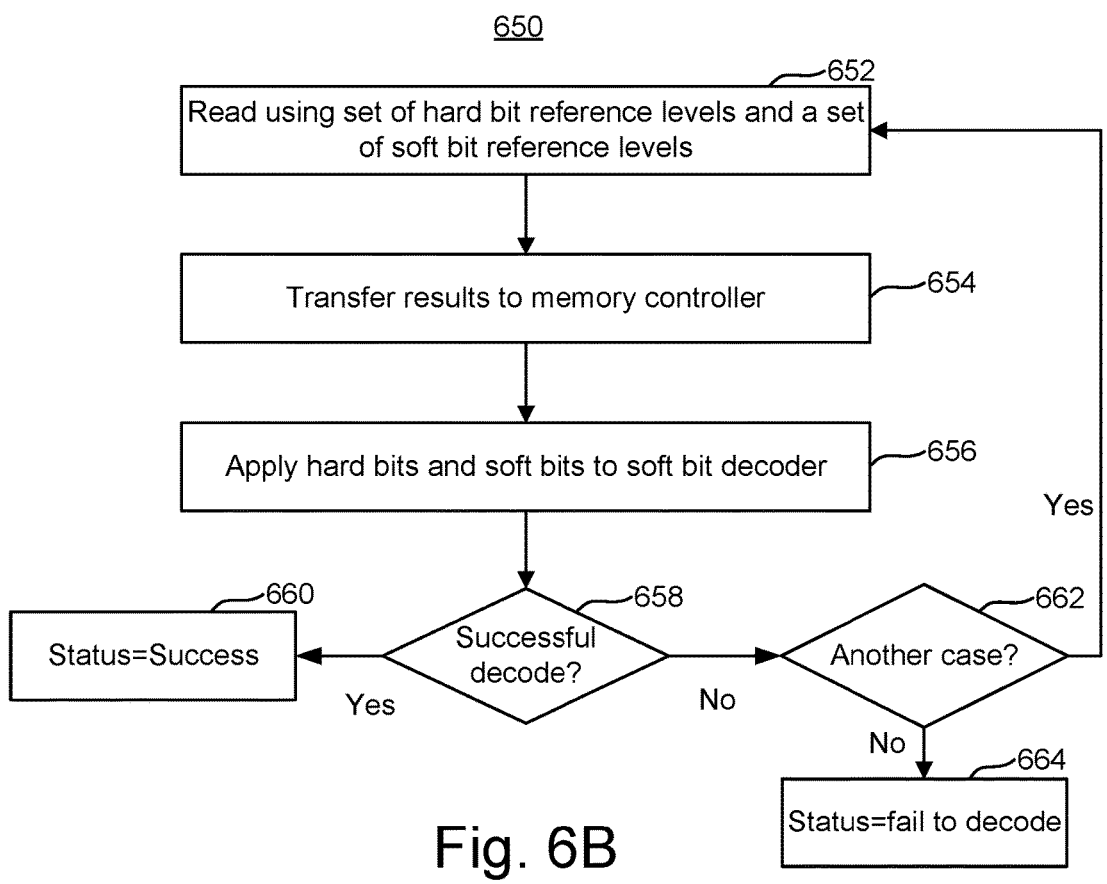
FIG. 6B is a flowchart of one embodiment of a process of hard bit plus soft bit reading/decoding.
Figure 6C:
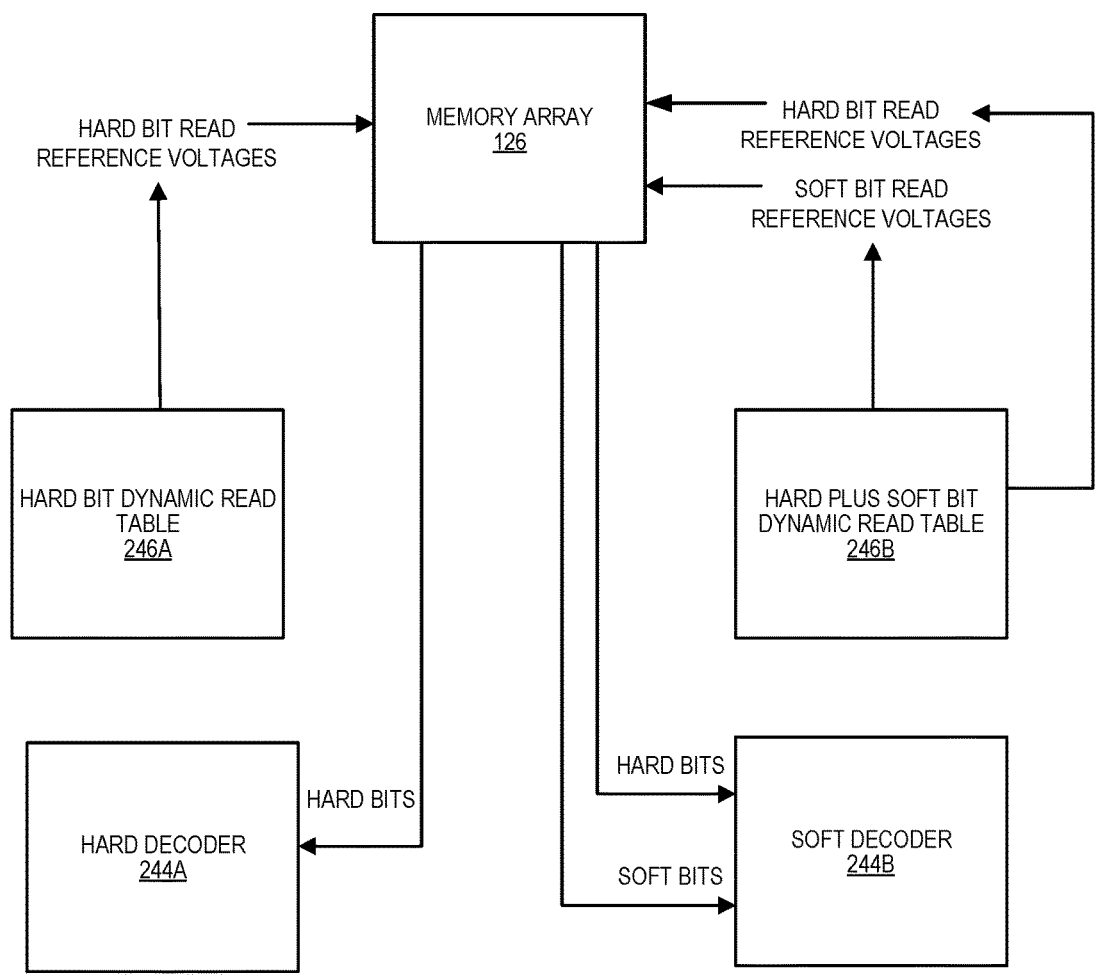
FIG. 6C shows a memory array, hard bit dynamic read table, hard plus soft bit dynamic read table, hard decoder, and soft decoder.

FIGS. 6A-6C depict further details of embodiments of hard and soft bit decoding. FIG. 6A is a flowchart of one embodiment of a process 600 of hard bit only reading/decoding. FIG. 6B is a flowchart of one embodiment of a process 650 of hard bit plus soft bit reading/decoding. FIG. 6C is a block level diagram of components that be used in process 600 and 650. FIG. 6C shows a memory array 126, hard bit dynamic read table 246A, hard plus soft bit dynamic read table 246B, hard decoder 244A, and soft decoder 244B.

Process 600 will now be described. Process 600 is one embodiment of step 306 of FIG. 3, which is for reading using one set of hard bit read reference voltages. In step 602, a group of non-volatile memory cells is read using a set of hard bit read reference levels. Step 602 may include applying the set of hard bit read reference levels to a selected word line associated with a group of memory cells.

Referring to FIG. 6C, the hard bit dynamic read table 246A may be accessed to determine hard bit read reference voltages to be applied to the group of memory cells. In one embodiment, the memory controller 122 accesses the hard bit dynamic read table 246A to obtain offsets to default hard bit read reference levels. The memory controller 122 sends a command to the memory die 108 containing the group of memory cells, instructing the memory die to perform a dynamic read, and also providing the offsets to the memory die 108, in one embodiment. In another embodiment, the memory controller 122 sends a command to the memory die 108 to perform dynamic read, but the memory die 108 contains the hard bit dynamic read table 246A.

In step 604, results of the read are transferred to the memory controller. Step 604 may include transferring bit values for each memory cell. For example, a code "001" or "100" may be transferred when three bits are stored per memory cell. In step 606, the hard bits are applied to a hard decoder. Referring to FIG. 6C, hard bits that are obtained from reading a group of memory cells in the memory array 126 are applied to a hard decoder 244A. For example, circuitry on the memory die 108 (e.g., read/write circuits 128 of FIG. 2B) may generate hard bits, which are transferred to the memory controller 122, which applies the hard bits to a hard decoder 244A.

Process 650 of FIG. 6B will now be described. Process 650 is one embodiment of steps 352-354 of FIG. 3. Note that process 650 iterates through a hard bit plus soft bit table 246B to attempt to decode data in a group of non-volatile memory cells. Also note that process 650 may be performed in response to all attempted cases for the hard bit only read process failing to successfully decode the data in a group of non-volatile memory cells.

In step 652, the group of non-volatile memory cells is read using a set of hard bit read reference voltages and a set of soft bit read reference voltages. In one embodiment, the process 650 starts with the first case in table 246B. Referring to the example table 246B of FIG. 5B, the first case is case 8. Case 8 has offsets that correspond to the offsets for case 8 in the hard bit only dynamic read table 246A, in one embodiment. For example, case 8 in the hard bit only dynamic read table 246A may have offsets OffA8, OffB8, OffC8, OffD8, OffE8, OffF8, and OffG8. Each of these may be an offset to a default voltage for the corresponding hard bit read reference voltages. Case 8 in the hard bit plus soft bit dynamic read table 246B may include these same offsets OffA8, OffB8, OffC8, OffD8, OffE8, OffF8, and OffG8. Referring to FIG. 1B, each memory cell in the group may be read at the depicted hard bit read reference levels, and also at the depicted soft bit read reference levels, as one example (with suitable offsets from table 246B).

Referring to FIG. 6C, the hard plus soft bit dynamic read table 246B may be accessed to determine hard bit read reference voltages to be applied to the group of memory cells. In one embodiment, the memory controller 122 accesses the hard plus soft bit dynamic read table 246B to obtain offsets to default hard plus soft bit read reference levels. The memory controller 122 sends a command to the memory die 108 containing the group of memory cells, instructing the memory die to perform a dynamic read, and also providing the offsets to the memory die 108, in one embodiment. In another embodiment, the memory controller 122 sends a command to the memory die 108 to perform dynamic read, but the memory die 108 contains the hard plus soft bit dynamic read table 246A.

In step 654, results from reading the group of memory cells at the various hard and soft bit read reference levels are transferred to the memory controller. Transferring the hard bits may be the same as for the hard bit only case. Note that reading at the hard bit read reference voltages may, in effect, place a memory cell into one of the eight states (e.g., Er, A, B, C, D, E, F, or G), with respect to the example of FIG. 1B. Reading at the combination of hard bits and soft bits may, in effect, place the memory cell into one of an additional set of "voltage bins." Just as the eight states can be encoded in three bits, the additional voltage bins can be encoded into a set of bits. The way in which soft bits map to the voltage bins can vary from scheme to scheme. Regardless, step 654 may transfer a set of hard bits and a set of soft bits to the memory controller, which together place the memory cell into one of the voltage bits.

In step 656, the hard bits and the soft bits are applied to a soft decoder. Referring to FIG. 6C, hard and soft bits that are obtained from reading a group of memory cells in the memory array 126 are applied to a soft decoder 244B. For example, circuitry on the memory die 108 (e.g., read/write circuits 128 of FIG. 2B) may generate hard bits and soft bits, which are transferred to the memory controller 122, which applies the hard bits and soft bits to a soft decoder 244B.

Step 658 is a test of whether the soft decoder was able to successfully decode the data. If so, the process 650 ends successfully (step 660). If the decoding was not successful, then a determination is made if there is another case to attempt from the hard bit plus soft bit dynamic read table 246B. If so, then the process 650 returns to step 652 to attempt read using the next case.

Step 662 may include the memory controller 122 determining whether there is another case in table 246B. If so, the memory controller 122 may send another command to the memory die 108 to perform dynamic read with the new offsets. On the other hand, if the memory die contains the table 246B, the memory controller 122 may send a command to the memory die 108 instructing it to perform another dynamic read.

If all of the cases in the table 246B are tried, but none are able to successfully decode the data, then the process 650 concludes with a status "fail to decode." Note that by one embodiment of table 246B having a small subset of the cases from table 246A, process 650 need not waste time and/or power attempting to read/decode with cases that are unlikely to be successful. Note that if process 650 fails, then another decoding technique may be attempted (see step 358 of FIG. 3B).

Figure 7:
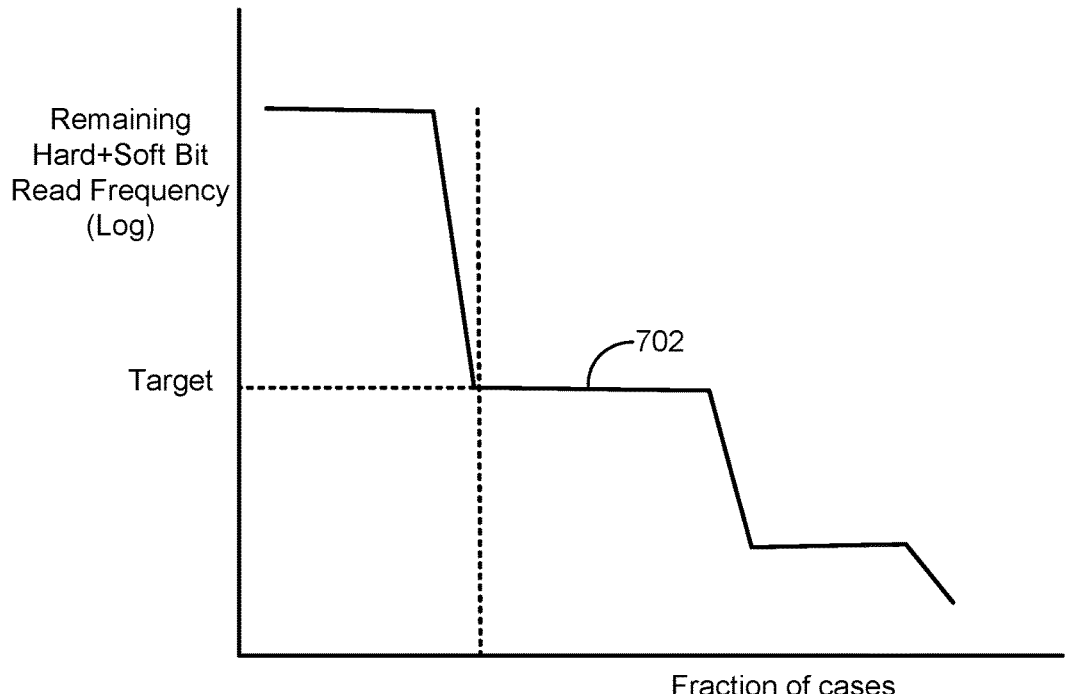
FIG. 7 is a graph that illustrates how using a limited number of cases in the hard bit plus soft bit table may still result in very few failures to decode the data.

FIG. 7 is a graph that illustrates how using a limited number of cases in the hard bit plus soft bit table 246B may still result in very few failures to decode the data. The curve 702 is based on the success of a hard plus soft bit case at decoding data. For example, a count of the number of times each of the cases in table 246B is successful at decoding can be made. Note that the counts may be done on a page basis or multi-page basis. This is for a table 246B in which the cases correspond to all of the hard bit cases from table 246A, for example. However, the cases have been ordered on the graph based on the frequency of success of the hard bit only decoding. The case were not necessarily performed in that order.

The curve 702 shows that only a small fraction of the cases need to be performed in order to successfully decode most of the time that an embodiment of the hard plus soft bit decode is used. The x-axis represents the fraction (e.g., percentage) of cases. Thus, moving to the right indicates another case has been added to the data represented by curve 702. The y-axis refers to the success of a given hard plus soft bit case. Note that the y-axis is represented a log value. The "target" on the y-axis refers to a target for the number of successful decodes. For example, cases above the target may be able to successfully decode 99% of the reads.

A suitable number of cases to include in the table(s) 246B can be determined based on curve 702. Note that this may be performed on page level, or multi-page level. When performed on a page level, curve 702 may suggest a different number of cases be used for different pages, based on the success of corresponding cases for a hard bit only read/decode. Thus, the memory system 100 may be programmed to build a lower page dynamic read table 246B having a first number of cases, a middle page dynamic read table 246B having a second number of cases, an upper page dynamic read table 246B having a third number of cases, as one example.

Also, the number of cases to use in a table 246B may be based on a percentage of the hard bit only cases. For example, for the lower page, based on empirical data it may be determined that it takes less than "x" percent of the hard bit cases to successfully decode over 99% of the time when using the hard plus soft bit decode. Therefore, the lower page dynamic read table 246B may be limited to "x" percent of the hard bit cases. For the middle page, based on empirical data it may be determined that it takes less than "y" percent of the hard bit cases to successfully decode over 99% of the time when using the hard plus soft bit decode. Therefore, the middle page dynamic read table 246B may be limited to "y" percent of the hard bit cases. For the upper page, based on empirical data it may be determined that it takes less than "z" percent of the hard bit cases to successfully decode over 99% of the time when using the hard plus soft bit decode. Therefore, the upper page dynamic read table 246B may be limited to "z" percent of the hard bit cases. The example of 99% successful decodes is for purpose of illustration; a higher or lower percentage could be used. Also, the foregoing examples may be applied to multi-page. For example, for multiple pages, based on empirical data it may be determined that it takes less than "q" percent of the hard bit cases to successfully decode over 99% of the time when using the hard plus soft bit decode. Therefore, a multi-page table 246B may be limited to "q" percent of the hard bit cases.

Figure 8:
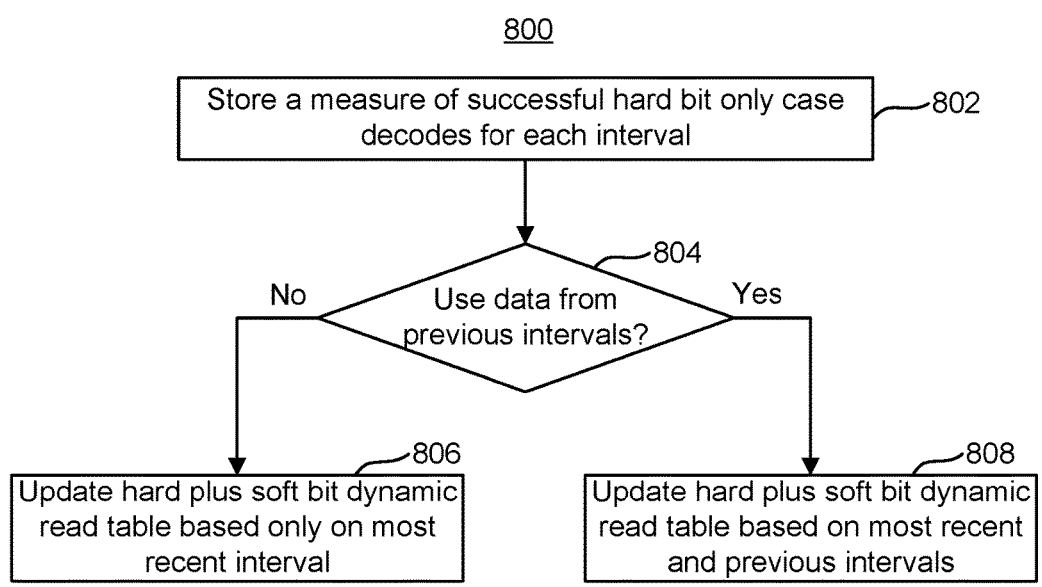
FIG. 8 is a flowchart of one embodiment of a process of updating the hard plus soft bit dynamic read table based on one or more intervals.

In one embodiment, the hard plus soft bit dynamic read table 246B is updated based only on the frequency of the successfully hard bit only cases from the most recent interval. In one embodiment, the hard plus soft bit dynamic read table 246B is updated based on the frequency of the successfully hard bit only cases from multiple intervals. FIG. 8 is a flowchart of one embodiment of a process 800 of updating the hard plus soft bit dynamic read table 246B based on one or more intervals. Step 802 includes storing a measure of successful case decodes for each interval. The measure could be a total count for each hard bit read case, a relative measure (such as a percentage), or some other measure. For example, if the total number of reads for each interval are the same, then a count might be used. Process 300 may be performed to determine the counts (or other measure) for each of the hard bit cases for a given interval. As noted above, the interval could be a read interval, which is measured as a certain number of reads.

In step 804, a determination is made whether data from previous intervals will be used to form the hard plus soft bit dynamic read table 246B. If not, the hard plus soft bit dynamic read table 246B is formed from data from just the most recent interval, in step 806.

If data from previous intervals is to be used, then the hard plus soft bit dynamic read table 246B is updated based on data from more than one interval, in step 808. In one embodiment, the data from older intervals given a lower weight then the data from more recent intervals. For example, successful adjustments to the default values of hard bit read reference voltages for the most recent interval may be given a higher weight than successful adjustments to the default values of hard bit read reference voltages for the older intervals. This weighting can be graded such that the oldest interval has the lowest weight, the next oldest interval the next lowest weight, etc.

In one embodiment, the hard plus soft bit dynamic read table 246B is formed based, at least in part, on successful decodes of previous hard plus soft bit decodes. For example, the memory system 100 may track counts of each case of hard plus soft bit decodes that are successful. This may be tracked during, for example, one read interval of process 300. The most frequently successful cases of hard plus soft bit decodes from this read interval can be used determine which cases should be included in the hard plus soft bit dynamic read table 246B and/or an order of the cases. Therefore, it may be stated that the hard plus soft bit dynamic read table 246B is modified based on the success of adjustments to default soft bit read reference voltages. Thus, attempts to decode the data stored in a group of non-volatile memory cells may further be based upon frequency of successful decodes using adjustments to default soft bit read reference voltages.

One embodiment includes a non-volatile storage system, comprising a plurality of non-volatile memory cells, and a control circuit in communication with the plurality of non-volatile memory cells. The control circuit is configured to identify which adjustments to default values for hard bit read reference voltages are most frequently successful to decode data in groups of the plurality of non-volatile memory cells using only hard bits. The control circuit is configured to attempt to decode the data in the group of non-volatile memory cells using dynamic hard bit read reference voltages and dynamic soft bit read reference voltages that correspond to only a subset of the most frequently successful adjustments to the default values for the hard bit read reference voltages, in response to a process that uses only hard bits to fail to successfully decode data in a group of the non-volatile memory cells.

One embodiment includes a method of operating a non-volatile storage system. The method comprises tracking which sets of dynamic hard bit read reference voltages result in successfully decoded data by a process that uses only hard bits to read and decode non-volatile memory cells in the non-volatile storage system. The method further comprises, in response to the process that uses only hard bits to failing to successfully decode data in a group of the non-volatile memory cells, attempting to decode the data stored in the group of non-volatile memory cells using dynamic hard bit read reference voltages and dynamic soft bit read reference voltages that use only the dynamic hard bit read reference voltages for the hard bit only read process that are most frequently successful at decoding data in the non-volatile memory cells.

One embodiment includes a non-volatile storage system, comprising a three dimensional array of non-volatile memory cells, and a control circuit in communication with the three dimensional array of non-volatile memory cells. The control circuit iterates through a first table of adjustments to default values of hard bit read reference voltages to attempt to decode data in non-volatile memory cells using only hard bit read reference voltages. The control circuit tracks counts of which adjustments to the default values of hard bit read reference voltages in the first table resulted in successfully decoded data. The control circuit forms a second table of adjustments to default values of hard and soft bit read reference voltages that has entries only for the most successful adjustments in the first table. The control circuit, in response to an attempt to read a group of the non-volatile memory cells using only hard bit read reference voltages failing to successfully decode data in a group of the non-volatile memory cells, iterates through the adjustments in the second table to attempt to decode the data in the group using both hard bit and soft bit read reference voltages.

One embodiment includes non-volatile storage system, comprising a plurality of non-volatile memory cells, means for reading groups of the non-volatile memory cells at sets of dynamic hard bit read reference voltages, means for decoding data stored in a group of the non-volatile memory cells using only a code from reading at the hard bit read reference voltages, means for tracking which of the sets of dynamic hard bit read reference voltages result in successfully decoded data using only the code from reading at the hard bit read reference voltages, means for detecting a failure to decode data in a group of the non-volatile memory cells using only the codes from reading at the hard bit read reference voltages; and means for attempting to decode the data in the group of non-volatile memory cells using dynamic hard bit read reference voltages and dynamic soft bit read reference voltages that use only the sets of dynamic hard bit read reference voltages that are most frequently successful at decoding data in the non-volatile memory cells using only the code from reading at the hard bit read reference voltages in response to a failure to decode data in a group of the non-volatile memory cells using only hard bits.

In one embodiment, the means for reading groups of the non-volatile memory cells at sets of dynamic hard bit read reference voltages; includes one or more of read/write circuits 128, sense blocks (SB1, SB2, . . . ), state machine 112, power control 116, on-chip address decoder 114, and/or other hardware and/or software.

In one embodiment, the means for decoding data includes one or more of controller 122, processor 122c, back end module 210, decoders 244, and/or other hardware and/or software.

In one embodiment, the means for tracking which of the sets of dynamic hard bit read reference voltages result in successfully decoded data using only the code from reading at the hard bit read reference voltages includes one or more of controller 122, processor 122c, back end module 210, decoders 244, and/or other hardware and/or software.

In one embodiment, the means for detecting a failure to decode data in a group of the non-volatile memory cells using only the codes from reading at the hard bit read reference voltages includes one or more of controller 122, processor 122c, back end module 210, decoders 244, and/or other hardware and/or software.

In one embodiment, the means for attempting to decode the data in the group of non-volatile memory cells using dynamic hard bit read reference voltages and dynamic soft bit read reference voltages that use only the sets of dynamic hard bit read reference voltages that are most frequently successful at decoding data in the non-volatile memory cells using only the code from reading at the hard bit read reference voltages includes one or more of read/write circuits 128, sense blocks (SB1, SB2, . . . ), state machine 112, power control 116, on-chip address decoder 114, controller 122, processor 122c, back end module 210, decoders 244, and/or other hardware and/or software.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
a plurality of non-volatile memory cells;
a control circuit in communication with the plurality of non-volatile memory cells, wherein the control circuit is configured to:
identify which adjustments to default values for hard bit read reference voltages are most frequently successful to decode data in groups of the plurality of non-volatile memory cells using only hard bits;
determine sets of dynamic hard bit read reference voltages and associated dynamic soft bit read reference voltages based on the adjustments to the default values for the hard bit read reference voltages that are most frequently successful;
in response to a process that uses only hard bits to fail to successfully decode data in a group of the non-volatile memory cells, execute a decoding technique on the data in the group of non-volatile memory cells using the sets of dynamic hard bit read reference voltages and associated dynamic soft bit read reference voltages; and
in response to the decoding technique failing to successfully decode data in the group of the non-volatile memory cells after using all of the sets of dynamic hard bit read reference voltages and associated dynamic soft bit read reference voltages, perform another decoding technique to decode the data in the group of non-volatile memory cells.

2. The non-volatile storage system of claim 1, wherein the control circuit is configured to:
identify which adjustments to the default values for the hard bit read reference voltages are most frequently successful to decode data in the groups of non-volatile memory cells for a plurality of intervals;
determine sets of dynamic hard bit read reference voltages and associated dynamic soft bit read reference voltages based on the adjustments to the default values for the hard bit read reference voltages that are most frequently successful for the most recent interval;
attempt to decode the data in a group of the non-volatile memory cells using the sets of dynamic hard bit read reference voltages and dynamic soft bit read reference voltages for only the most recent interval; and
in response to the attempt to decode the data in the group using the sets of dynamic hard bit read reference voltages and dynamic soft bit read reference voltages for only the most recent interval, use another decoding technique to decode the data in the group of non-volatile memory cells.

3. The non-volatile storage system of claim 1, wherein the control circuit is configured to:
identify which adjustments to the default values for the hard bit read reference voltages are most frequently successful at decoding data in the groups of non-volatile memory cells for a plurality of intervals;
determine sets of dynamic hard bit read reference voltages and associated dynamic soft bit read reference voltages based on the adjustments to the default values for the hard bit read reference voltages that are most frequently successful for each of the plurality of intervals, wherein the control circuit is configured to apply a higher weight to successful adjustments during intervals closer to the present time than previous intervals;
attempt to decode the data in a group of the non-volatile memory cells using the sets of dynamic hard bit read reference voltages and dynamic soft bit read reference voltages for each of the plurality of intervals.

4. The non-volatile storage system of claim 1, wherein the control circuit is configured to identify which adjustments to the default values for the hard bit read reference voltages are most frequently successful at decoding data in groups of the non-volatile memory cells at a system-wide level, wherein the control circuit is configured to determine the sets of dynamic hard bit read reference voltages and associated dynamic soft bit read reference voltages based on the adjustments to the default values for the hard bit read reference voltages that are most frequently successful at the system-wide level.

5. The non-volatile storage system of claim 1, further comprising a plurality of memory die, wherein the plurality of non-volatile memory cells reside on the plurality of memory die, wherein the control circuit is configured to identify which adjustments to the default values for the hard bit read reference voltages are most frequently successful at decoding data in groups of the non-volatile memory cells on each memory die, wherein the control circuit is configured to determine the sets of dynamic hard bit read reference voltages and associated dynamic soft bit read reference voltages based on the adjustments to the default values for the hard bit read reference voltages that are most frequently successful for a given memory die having the group of non-volatile memory cells.

6. The non-volatile storage system of claim 1, wherein to execute the decoding technique on the data in the group of non-volatile memory cells using the sets of dynamic hard bit read reference voltages and dynamic soft bit read reference voltages the control circuit is configured to: iterate through a table of adjustments to the default values of the hard bit read reference voltages and of adjustments to default values of soft bit read reference voltages.

7. The non-volatile storage system of claim 1, further comprising a three-dimensional array, wherein a group of the plurality of non-volatile memory cells reside in the three-dimensional array.

8. The non-volatile storage system of claim 1, wherein the control circuit is configured to use only a number of sets of the dynamic hard bit read reference voltages and the associated dynamic soft bit read reference voltage to achieve a target success rate at decoding the data in the group prior to using the other decoding technique to decode the data in the group.

9. The non-volatile storage system of claim 1, wherein to perform the other decoding technique the control circuit is configured to identify optimal read reference voltages.

10. The non-volatile storage system of claim 9, wherein to identify optimal read reference voltages the control circuit is configured to scan of the plurality of non-volatile memory cells to determine a shape of threshold voltage distributions for the plurality of non-volatile memory cells.

11. The non-volatile storage system of claim 1, wherein to perform the other decoding technique the control circuit is configured to use a decoding technique that uses the sets of dynamic hard bit read reference voltages and associated dynamic soft bit read reference voltages but with a decoding algorithm that is stronger but slower than the decoding technique that failed to successfully decode the data in the group using the sets of dynamic hard bit read reference voltages and associated dynamic soft bit read reference voltages.

12. A method of operating a non-volatile storage system having a plurality of non-volatile memory cells, the method comprising:
    identifying which adjustments to default values for hard bit read reference voltages are most frequently successful to decode data in groups of the plurality of non-volatile memory cells using only hard bits;
    determining sets of dynamic hard bit read reference voltages and associated dynamic soft bit read reference voltages, the hard bit read reference voltages in each set being based on the most frequently successful adjustments to the default values for hard bit read reference voltages;
    in response to a process that uses only hard bits to fail to successfully decode data in a group of the non-volatile memory cells, executing a decoding technique on the data stored in the group of non-volatile memory cells using the sets of dynamic hard bit read reference voltages and dynamic soft bit read reference voltages; and
    in response to the decoding technique failing to successfully decode data in the group of the non-volatile memory cells after using all of the sets of dynamic hard bit read reference voltages and associated dynamic soft bit read reference voltages, decoding the data in the group of non-volatile memory cells with another decoding technique.

13. The method of claim 12, wherein the identifying which adjustments to default values for hard bit read reference voltages are most frequently successful to decode data in groups of the plurality of non-volatile memory cells using only hard bits is performed for a plurality of read intervals, wherein the determining the sets of dynamic hard bit read reference voltages and associated dynamic soft bit read reference voltages is based on the most frequently successful dynamic hard bit read reference voltages for only the most recent read interval.

14. The method of claim 12, wherein the identifying which adjustments to default values for hard bit read reference voltages are most frequently successful to decode data in groups of the plurality of non-volatile memory cells using only hard bits is performed for a plurality of read intervals, wherein the determining sets of dynamic hard bit read reference voltages and associated dynamic soft bit read reference voltages is based on a weighted adjustment to the most frequently successful adjustments to the dynamic hard bit read reference voltages for each of the read intervals, comprising weighting successful adjustments during read intervals closer to the present time higher than previous read intervals.

15. The method of claim 12, wherein the identifying which adjustments to default values for hard bit read reference voltages are most frequently successful to decode data in groups of the plurality of non-volatile memory cells using only hard bits is performed on a storage system-wide level, wherein the determining the sets of dynamic hard bit read reference voltages and associated dynamic soft bit read reference voltages is based on the identifying for the storage system-wide level.

16. The method of claim 12, wherein the identifying which adjustments to default values for hard bit read reference voltages are most frequently successful to decode data in groups of the plurality of non-volatile memory cells using only hard bits is performed on memory die by memory die basis, wherein the determining the sets of dynamic hard bit read reference voltages and associated dynamic soft bit read reference voltages is based on the identifying for the memory die that contains the group of non-volatile memory cells.

17. The method of claim 12, wherein the executing a decoding technique on the data stored in the group of non-volatile memory cells is further based upon frequency of successful decodes using adjustments to default soft bit read reference voltages.

18. The method of claim 12, wherein the executing the decoding technique on the data stored in the group of non-volatile memory cells comprises: iterating through a table comprising the sets of the dynamic hard bit read reference voltages and the associated dynamic soft bit read reference voltages.

19. A non-volatile storage system, comprising:
    a plurality of non-volatile memory cells;
    means for reading groups of the non-volatile memory cells at sets of dynamic hard bit read reference voltages, including means for determining a code for each non-volatile memory cell in the group, each code representing a prediction of bits programmed into each non-volatile memory cell, wherein each of the sets has an adjustment to a default value of each hard bit read reference voltage;

means for decoding data stored in a group of the non-volatile memory cells using only the codes from reading at the hard bit read reference voltages in a given set of the dynamic hard bit read reference voltages;

means for identifying which adjustments to the default values for the hard bit read reference voltages are most frequently successful to decode data in the groups using only the hard bit read reference voltages;

means for determining sets of dynamic hard bit read reference voltages and associated dynamic soft bit read reference voltages, the hard bit read reference voltages in each set being based on the most frequently successful adjustments to the default values for hard bit read reference voltages;

means for detecting a failure to decode data in a selected group of the non-volatile memory cells using only the codes from reading at the hard bit read reference voltages; and means for responding to the failure to decode data in the selected group using only the codes from reading at the hard bit read reference voltages by executing a decoding technique on the data stored in the selected group using the sets of dynamic hard bit read reference voltages and dynamic soft bit read reference voltages; and means for using another decoding technique to decode the selected group in response to a failure to decode data in the selected group after using the decoding technique with all of the sets of dynamic hard bit read reference voltages and dynamic soft bit read reference voltages.

20. The non-volatile storage system of claim 19, wherein the means for identifying which adjustments to default values for the hard bit read reference voltages are most frequently successful to decode data in the groups using only the hard bit read reference voltages comprises means for tracking on a system wide level, and means for tracking on a memory die by memory die basis.

* * * * *